United States Patent [19]

Andreev et al.

[11] Patent Number: 4,466,991
[45] Date of Patent: Aug. 21, 1984

[54] CUTTING TOOL HARDENING METHOD

[75] Inventors: Anatoly A. Andreev, Kharkov; Alexei G. Gavrilov, Moskovskaya; Galina K. Galitskaya, Moscow; Viktor P. Zhed, Moscow; Andrei K. Sinelschikov, Moscow; Valentin G. Padalka; Vladimir T. Tolok, both of Kharkov, all of U.S.S.R.

[73] Assignee: Vsesojuzny Nauchno-Issledovatelsky Instrumentalny Institut, Moscow, U.S.S.R.

[21] Appl. No.: 462,996

[22] Filed: Feb. 1, 1983

[51] Int. Cl.³ .............................................. C23C 11/08
[52] U.S. Cl. .................................. 427/38; 204/192 N; 427/318; 427/255.2
[58] Field of Search ...................... 427/38, 39, 42, 318, 427/255.1, 255.2, 255.4; 204/192 N

[56] References Cited

U.S. PATENT DOCUMENTS 3,900,592  8/1975  Kennedy et al. .................... 427/39
3,915,757 10/1975  Engel ................................... 427/38
4,346,123  8/1982  Kaufmann ........................... 427/38

FOREIGN PATENT DOCUMENTS 2036203 12/1970  France ............................... 427/318

Primary Examiner—John H. Newsome
Attorney, Agent, or Firm—McAulay, Fields, Fisher, Goldstein & Nissen

[57] ABSTRACT

A cutting tool hardening method, according to which a tool to be hardened is heated in air to a temperature of 130° to 560° C. in order to produce an oxide film 200 to 10,000 Å thick on its surface which is then coated with a wear-resistant material by vacuum deposition.

9 Claims, 1 Drawing Figure

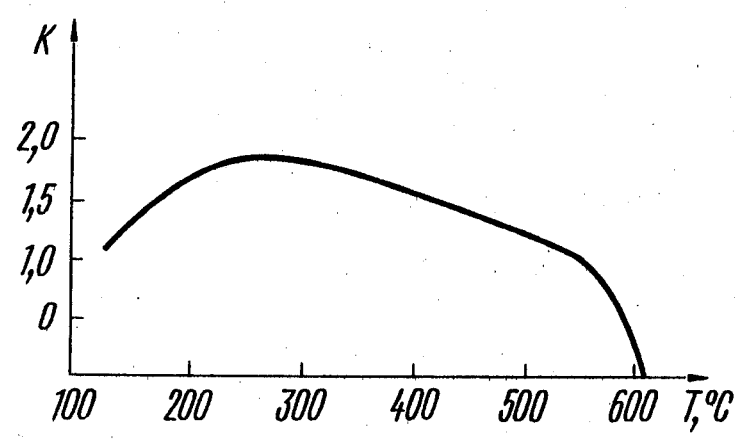

CUTTING TOOL HARDENING METHOD

FIELD OF THE INVENTION

The present invention relates to the manufacture of cutting tools. More specifically, it is concerned with a method for hardening cutting tools of high-speed steels or hard alloys by coating them with wear-resistant materials. The method according to the invention is applicable to the fabrication of all types of cutting tools.

BACKGROUND OF THE INVENTION

There is known a method for hardening cutting tools by providing them with a wear-resistant coating. According to this method, tools are placed in a vacuum chamber and heated to a temperature of 400° to 500° C. by using steady heat sources. A titanium evaporator is switched on and nitrogen is admitted into the chamber where pressure is maintained at a level of about $1 \cdot 10^{-3}$ mm of mercury (cf. L. M. Djalamanova, "Progressivnye metody sozdaniya iznosostoykykh pokrytiy na rezhushchem instrumente"/"Advanced Methods for Providing Wear-Resistant Coatings on Cutting Tools"/in a collection of papers under the general title "Technologiya proizvodstva i nauchnaya organizatsiya truda i upravleniya"/"Industrial Engineering and Management"/, No. 11, Moscow, 1979). A hard, wear-resistant film of titanium nitride is deposited on the tools, whereby their wear resistance increases several times over. However, the adhesion of the coating to the tool surface is inadequate. The coating tends to peel off, which shortens the service life of the tool.

There is known another method for hardening cutting tools of high-speed steels, which consists in vacuum deposition of a wear-resistant material on the surface of the tools. The deposition process comprises condensation and ion bombardment (cf. USSR Inventor's Certificate No. 607,659, Cl. B 23 B 27/00).

This method is carried out as follows. Cutting tools to be hardened are placed in a vacuum chamber where high vacuum is produced. A negative voltage of 1 to 2 kV is applied to the tools and vacuum-arc evaporators are turned on. The tools are heated as they are being bombarded by ions of titanium accelerated to an energy of 1 to 2 keV by the negative potential. During 3 to 5 minutes, the surface of the tools is cleaned by ions. After the ion bombardment, the potential across the cutting tools is reduced to a level of 100 to 250 V and nitrogen is admitted into the chamber at a pressure of $2 \cdot 10^{-3}$ mm of mercury. A layer of titanium nitride with a microhardness of about 2,500 kg/mm$^2$ is deposited on the surface of the tools. After 5 to 7 minutes, the pressure in the chamber is reduced to $3 \cdot 10^{-5}$ mm of mercury and maintained at this level for 2 to 3 minutes. During this time a layer with a microhardness of about 700 kg/mm$^2$ is deposited on the surface of the tools. By varying the nitrogen pressure, it is possible to obtain a coating consisting of layers with different microhardnesses. Such layers adhere very well to the tool surface and effectively withstand microshocks and vibration. They also ensure a high degree of reproducibility when the tools are resharpened.

A titanium nitride coating produced through the use of the above method is destroyed during cutting due to the heating, softening, and plastic deformation of the base metal caused by friction.

Some part of the heat resulting from the cutting process is removed with the chips, but a greater part of it is transmitted to the base metal due to a good thermal contact between the coating and the base metal, and a high thermal conduction of titanium nitride.

Ion bombardment heating of cutting tools of a great weight and size takes as long as 25 to 35 minutes. Apart from taking up so much time, this process affects the surface finish of tools and blunts their cutting edges. It may even burn the cutting edges.

OBJECTS AND SUMMARY OF THE INVENTION

It is an object of the present invention to raise the resistance of cutting tools to heat caused by friction during the cutting process.

It is another object of the invention to avoid damaging cutting edges during the manufacture of cutting tools.

It is a further object of the invention to speed up the manufacture of cutting tools of high-speed steels and hard alloys.

The invention provides a cutting tool hardening method comprising vacuum deposition of a wear-resistant material on the surface of cutting tools wherein, prior to deposition, the cutting tools are heated in air to a temperature of 130° to 560° C. during a period of time long enough to produce an oxide film 200 to 10,000 Å thick on their surface.

BRIEF DESCRIPTION OF THE ATTACHED DRAWING

Other objects and advantages of the present invention will become more apparent from a consideration of the following detailed description of a preferred embodiment thereof, taken in conjunction with the accompanying drawing which is a plot of the resistance coefficient K of a cutting tool, laid off on the y-axis, versus the preheat temperature T°C., laid off on the x-axis.

DETAILED DESCRIPTION OF THE INVENTION

The method of this invention, intended for hardening cutting tools of high-speed steels or hard alloys, provides cutting tools with a coating which protects the base metal from the effects of heat caused by friction during the cutting process. A reduction in the ion bombardment time prior to vacuum deposition of the protective coating enhances the wear resistance of cutting tools and is a factor which speeds up the cutting tool manufacture.

The method according to the invention is carried out as follows.

Cutting tools to be hardened are degreased, washed, and heated in air in a drying cabinet to a temperature of 130° to 560° C. Depending on their weight, they are maintained at that temperature during 1 to 60 minutes. The temperature of 130° C. and the preheat time of 1 minute are barely sufficient for an oxide film to be formed on the surface of cutting tools. If the preheat temperature and time exceed 560° C. and 60 minutes, respectively, the coating becomes too thick and its strength deteriorates.

The optimum thickness of the oxide film on the surface of cutting tools is 200 to 10,000 Å. Such a film displays strong adhesion to the cutting tool surface.

The cutting tools are then placed in a vacuum chamber which is evacuated till the pressure drops to $(1-3)\cdot 10^{-5}$ mm of mercury. A negative voltage of 1 to 2 kV is applied to the tools and titanium evaporators are turned on. Ions of titanium are accelerated by the negative potential and bombard the surface of the cutting tools, thus cleaning and heating it. After 2 to 5 minutes, the potential across the cutting tools is reduced to a level of 100 to 250 V and nitrogen is admitted into the chamber where the pressure is maintained at a level of 1 to 3 mm of mercury. A layer of titanium nitride is deposited on the surface of the cutting tools during 5 to 7 minutes, whereupon the nitrogen pressure in the chamber is brought down to $8 \cdot 10^{-5}$ mm of mercury and a titanium nitride layer is deposited during 2 to 3 minutes. After this the pressure is raised again and the above sequence of events is repeated 6 to 10 times.

The oxide film between the external wear-resistant coating and the base metal has a low thermal conductivity and prevents the transfer of heat produced during cutting to the base metal of the cutting tool. This film produces a temperature gradient across the thin surface layers and thus increases the amount of heat removed with the chips. The oxide film reduces the thermal load on the base metal and improves the wear resistance of the tool. FIG. 1 is a plot illustrating the results of laboratory tests and showing the cutting tool resistance coefficient K versus the temperature at which the cutting tool is preheated in air during 30 minutes and the oxide film thickness. K is the resistance coefficient of straight-turning tools of steel containing 0.4 to 0.5% of C, 0.17 to 0.37% of SiO, and 0.5 to 0.8% of Mn. The cutting parameters are as follows: V=50 m/min, S=15 mm/rev, t=9.5 mm.

All the tools under investigation were manufactured from one and the same batch of steel by using identical manufacturing techniques. Each point of the curve is the result of statistical processing of data obtained by testing five tools.

Heat treatment within the above-mentioned temperature range and under high vacuum did not improve the wear resistance of the tools, because an oxide film cannot be formed under high vacuum.

It must be noted at this point that heating cutting tools just before they are placed in a vacuum chamber is highly advantageous. In the case of heavy tools, such as forming tools and pinion cutters, it takes 25 to 30 minutes to heat the tools placed in a vacuum chamber to a desired temperature of 450° to 530° C. The long heating time affects the working surfaces and may lead to overheating of the cutting edges, not forgetting that it constitutes a large proportion of the overall tool hardening time.

If preheating is used, the time required to heat heavy tools placed in a vacuum chamber is reduced to a mere 5 to 8 minutes. This time is too short for the ion bombardment to blunt or burn the cutting edges. In addition, moisture and gases are easily desorbed from preheated tools, which cuts down the evacuation time.

A better understanding of the method according to the invention will be had from a consideration of the following examples.

EXAMPLE 1

Parting tools of steel containing about 6% of W, about 5% of Mo, and 0.8 to 1% of C were washed in gasoline and wiped with clean cloth soaked in alcohol. They were then placed in holders, each accommodating 25 tools. The holders were put in a drying cabinet where the temperature was maintained at 300° C. The temperature of the tools was measured by thermocouples. When the temperature of the tools went up to about 280° C., they were removed from the cabinet and one of them was examined to check the oxide layer parameters. The holders were then placed on a turntable in a BULAT vacuum chamber which was closed and evacuated to a pressure of $2 \cdot 10^{-5}$ mm of mercury. Negative voltage of 1.1 kV was applied to the turntable and tools. The turntable was set in rotation and two evaporators were switched on. In both of them the arc current intensity was 90 A. In the course of the ion bombardment, carried out with a view to heating the tools and cleaning their surface, the temperature of the tools was monitored with the aid of an infrared pyrometer. After about 7 minutes, the temperature of the tools reached 450° C. The voltage applied to the turntable and tools was reduced to 250 V, a third evaporator was brought into play, and nitrogen was admitted into the vacuum chamber where the pressure was set at $2 \cdot 10^{-3}$ mm of mercury. After 7 minutes the nitrogen pressure was brought down to $8 \cdot 10^{-5}$ mm of mercury and maintained at that level for 3 minutes, whereupon it was again raised to $2 \cdot 10^{-3}$ mm of mercury and the above sequence of events was repeated 10 times. The vacuum deposition being over, the chamber was opened and the tools were removed therefrom.

The oxide layer thickness on a test tool, measured with the aid of an optical interferometer, was 800 Å.

Tools thus treated were used on a six-spindle automatic machine for cutting inner races of steel containing 0.95 to 1.05% of C, 0.17 to 0.37% of Si, 0.2 to 0.4% of Mn, and 1.3 to 1.65% of Cr. Each tool cut an average of 1,000 races, whereas tools with a similar protective coating, but without an oxide layer can only cut an average of 800 races.

EXAMPLE 2

Prior to vacuum deposition, a batch of 30 drills 5 mm in diameter manufactured from steel containing about 6% of W, about 5% of Mo, and 0.8 to 1% of C was washed in gasoline and dried by warm compressed air. The drills were then placed in solution containing 100 ml of $H_2O$, 20 g of $Na_2CO_3$, and 20 g of $Na_3PO_4$. The solution, contained in a bath, was maintained at a temperature of 50° to 60° C. The drills were exposed to ultrasound for 3 minutes, washed with running water, rinsed in distilled water, immersed in alcohol and dried by a flow of compressed air.

The batch of 30 drills was divided into six groups of five drills. Twenty five of them were preheated in drying cabinets for different periods of time, the temperature in the drying cabinets being maintained at different levels (see Table 1). Five drills were not preheated. All the drills were simultaneously placed in a BULAT vacuum chamber. A wear-resistant coating of titanium nitride was vacuum-deposited on the surface of the drills as is described in Example 1, but with the nitrogen pressure being maintained at a constant level of $(3-5) \cdot 10^{-3}$ mm of mercury.

TABLE 1

| Serial No. | T, C.° | τ, min | h, Å | n | K |
|---|---|---|---|---|---|
| 1 | 130 | 60 | 300 | 403 | 1.3 |
| 2 | 150 | 40 | 500 | 465 | 1.5 |
| 3 | 225 | 35 | 2500 | 558 | 1.8 |
| 4 | 300 | 60 | 10000 | 465 | 1.5 |
| 5 | 350 | 60 | 10400 | 372 | 1.2 |

Wear resistance of the drills was tested on a Wesselman KM-4 upright-drilling machine. The drills were used to drill holes in steel containing 0.4 to 0.5% of C, 0.17 to 0.37% of Si, and 0.5 to 0.8% of Mn. The drilling parameters were as follows: V=45 m/min, S=0.18 mm/rev, the drilling depth t=15 mm. A drill was pronounced to be blunt as soon as it began to make a creaking sound. Table 1 lists the temperature at which and the time during which the drills were preheated in air prior to vacuum deposition. It also lists the oxide layer thickness and wear resistance data. In Table 1:

Serial No. is the number of a group of drills;
T is the drill heating temperature;
$\tau$ is the drill heating time;
h is the thickness of the oxide layer;
n is the number of drilled holes averaged for the five drills of each group; and
K is the relationship between the number of holes drilled by preheated drills and the number of holes made by drills which were not preheated prior to vacuum deposition.

A drill not preheated prior to vacuum deposition of a titanium nitride coating makes an average of 310 holes.

EXAMPLE 3

A batch of 25 drills is cleaned as in Example 2. The drills have a diameter of 5 mm and are manufactured from steel containing about 6% of W, about 5% of Mo, and 0.8 to 1% of C. The batch is divided into 5 groups of 5 drills in each. Four groups were preheated in air in a muffle furnace under different conditions listed in Table 2. All the five groups were simultaneously placed in a BULAT vacuum chamber where a coating of titanium nitride was vacuum-deposited on the surface of the drills.

The drills were tested on a machine with a mechanical feed. They were used to drill holes in steel containing 0.4 to 0.5% of C, 0.17 to 0.37% of Si, and 0.5 to 0.8% of Mn. The drilling parameters were as follows: the cutting speed V=10 m/min, the feedrate S=4 mu/rev, the hole depth t=15 mm. Each of the drills that were not preheated prior to vacuum deposition made an average of 200 holes.

TABLE 2

| Serial No. | T, C° | $\tau$, min | h, Å | n | K |
|---|---|---|---|---|---|
| 1 | 450 | 15 | 700 | 320 | 1.6 |
| 2 | 500 | 5 | 400 | 280 | 1.4 |
| 3 | 550 | 2 | 200 | 260 | 1.3 |
| 4 | 560 | 0.5 | 180 | 240 | 1.2 |

The designations used in Table 2 are as those in Table 1.

EXAMPLE 4

Cutting tips of a hard alloy containing 92% of WC and 8% of Co were washed in a detergent, thoroughly rinsed in hot running water and heated during 15 to 60 minutes to a temperature in the range of 130° to 550° C. The heating was done in air in a drying cabinet. The thickness of the oxide film produced on the surface of the tips was measured with the aid of an optical interferometer.

These tips and a control batch of not preheated tips were placed in a BULAT vacuum chamber where condensation and ion bombardment were used to produce a wear-resistant coating of zirconium nitride on the surface of the tips under the conditions described in Example 1. In the case of Example 4, however, the tips were heated to 650° C. by the ion bombardment.

The tips were tested on a lathe where they were mechanically clamped in the cutter. The tips were used to cut a titanium alloy containing 5.5 to 7.0% of Al, 2.0 to 3.0% of Mo, and 0.8 to 0.23% of Cr, the rest being Ti. The cutting conditions were as follows: V=74 mm/min, S=0.15 mm/rev, t=1.5 mm. A tip was said to be blunt when the flank wear amounted to 0.3 mm.

The results of the wear resistance tests for five hard-alloy tips are listed in Table 3.

TABLE 3

| Oxide Layer Thickness h, Å | No. Oxide Layer | 180 | 200 | 5000 | 10000 | 11000 |
|---|---|---|---|---|---|---|
| Cutting Time, min | 0.15 | 0.18 | 0.22 | 0.35 | 0.3 | 0.25 |

Examples 1 through 4 indicate that preheating of cutting tools in air with a view to forming an oxide film on their surface prior to vacuum deposition of a wear-resistant coating increases the wear resistance of the tools by 30 to 80 percent, as compared with tools where the coating is provided on the non-oxidized base metal.

What is claimed is:

1. A cutting tool hardening method comprising the steps of preheating tools in air to a temperature of 130° to 560° C. during a period of time long enough to produce an oxide film 200 to 10,000 Å thick on their surface, and coating said tools with a wear-resistant material by vacuum deposition.

2. The method of claim 1, wherein said vacuum deposition is carried out under an inert atmosphere.

3. The method of claim 1, wherein said tools are first degreased and washed prior to said preheating.

4. The method of claim 1, wherein said preheating is carried out for 1 to 60 minutes.

5. The method of claim 1, wherein said preheating is carried out for 15 to 60 minutes at a temperature of 130° to 550° C.

6. The method of claim 2, wherein said inert atmosphere consists of nitrogen and the wear-resistant material deposited is titanium nitride or zirconium nitride.

7. The method of claim 6, wherein said tools are first degreased and washed prior to preheating.

8. The method of claim 4, wherein said vacuum deposition is carried out under an inert atmosphere.

9. The method of claim 8, wherein said tools are first degreased and washed prior to said preheating.

* * * * *